(12) United States Patent
Tanaka et al.

(10) Patent No.: US 7,031,153 B2
(45) Date of Patent: Apr. 18, 2006

(54) DISK MODULE, AND DISK ARRAY APPARATUS

(75) Inventors: Shigeaki Tanaka, Kanagawa (JP); Yasuji Morishita, Kanagawa (JP)

(73) Assignee: Hitachi, Ltd., Tokyo (JP)

( * ) Notice: Subject to any disclaimer, the term of this patent is extended or adjusted under 35 U.S.C. 154(b) by 187 days.

(21) Appl. No.: 10/712,558

(22) Filed: Nov. 12, 2003

(65) Prior Publication Data

US 2004/0145869 A1 Jul. 29, 2004

(30) Foreign Application Priority Data

Nov. 13, 2002 (JP) ............................ 2002-329807
Sep. 30, 2003 (JP) ............................ 2003-341380

(51) Int. Cl.
*G06F 1/20* (2006.01)

(52) U.S. Cl. ...................................... 361/687; 361/683
(58) Field of Classification Search ......... 361/684–687
See application file for complete search history.

(56) References Cited

U.S. PATENT DOCUMENTS

| | | | |
|---|---|---|---|
| 5,880,955 A | | 3/1999 | Matoba et al. |
| 6,150,050 A | * | 11/2000 | Mathew et al. ............... 429/49 |
| 6,175,490 B1 | * | 1/2001 | Papa et al. .................. 361/686 |
| 6,373,696 B1 | | 4/2002 | Bolognia et al. |
| 6,490,123 B1 | | 12/2002 | Okunaga et al. |
| 6,754,082 B1 | | 6/2004 | Ding et al. |
| 6,853,546 B1 | * | 2/2005 | Rabinovitz ................. 361/685 |
| 6,862,173 B1 | * | 3/2005 | Konshak et al. ............ 361/685 |
| 2002/0015287 A1 | | 2/2002 | Shao |

FOREIGN PATENT DOCUMENTS

| | | |
|---|---|---|
| JP | 8-124375 | 5/1996 |
| JP | 11-220680 | 8/1999 |
| JP | 11-238375 | 8/1999 |
| JP | 2000-82887 | 3/2000 |
| JP | 2001-312884 | 9/2001 |
| JP | 2001-332078 | 11/2001 |
| JP | 2002-124075 | 4/2002 |

* cited by examiner

*Primary Examiner*—Yean-Hsi Chang
(74) *Attorney, Agent, or Firm*—Townsend and Townsend and Crew LLP

(57) ABSTRACT

A disk module with a disk for recording information and a controller for controlling operation of the disk in a cabinet, is formed by providing a heat radiation member on at least one of two side faces of the cabinet. The disk array apparatus includes a plurality of disk boxes, each of which accommodates a plurality of the disk modules therein and has an inlet surface on one end side and an exhaust surface on the other end side; a rack which can accommodate the disk boxes therein in a stacking manner and of which surfaces facing the inlet surfaces of the boxes are capable of ventilation; and an exhaust fan arranged in the rack. The heat radiation member is provided on at least one of the two side faces of the cabinet for each disk module, which are parallel to the recording surface of the disk.

16 Claims, 11 Drawing Sheets

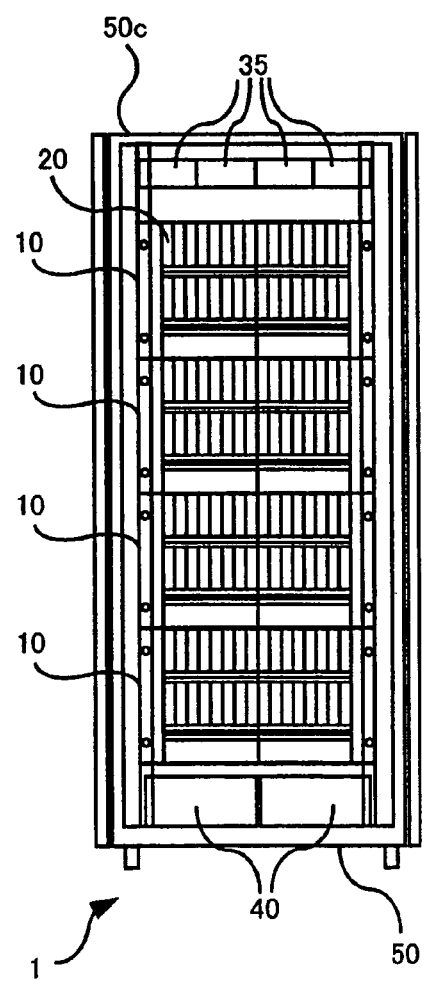
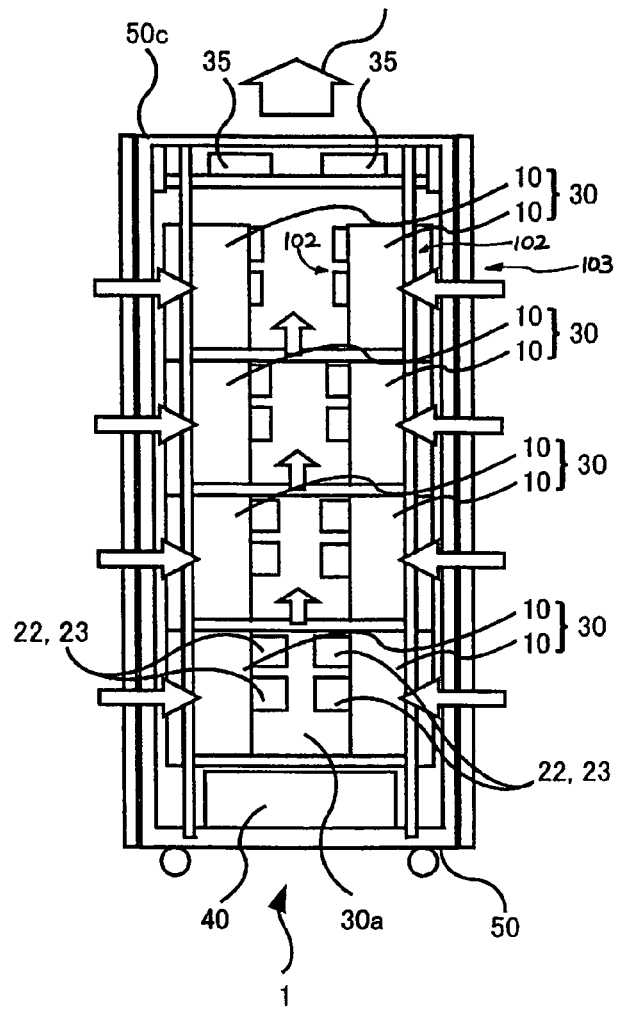

DISK MODULE, AND DISK ARRAY APPARATUS

CROSS-REFERENCE TO RELATED APPLICATIONS

The present application claims priority upon Japanese Patent Application No. 2002-329807 filed on Nov. 13, 2002 and Japanese Patent Application No.2003-341380 filed on Sep. 30, 2003, which are herein incorporated by reference.

BACKGROUND OF THE INVENTION

1. Field of the Invention

The present invention relates to a disk module and a disk array apparatus.

2. Description of the Related Art

In general, part of electric power supplied for operating a disk module is converted, for example, into frictional heat due to the rotation of a disk in the disk module and resistance heat of an electronic circuit section. In a disk array apparatus configured of a plurality of the disk modules, amounts of such generated heat become larger as the disk modules are packaged in higher density. Operating characteristics of the disk array apparatus is lowered when the disk array apparatus has a high temperature due to the generated heat. Accordingly, it is necessary to cool the apparatus while the apparatus is being supplied with the electric power.

In a disk array apparatus in recent years, for example, as represented by a large-scale disk array apparatus of a RAID (Redundant Array of Independent Disks) system, a storage capacity thereof has tended to be increased. Specifically, the total number of disk modules included in the disk array apparatus has been increased. Here, if the total number of disk modules is intended to be increased while limiting a footprint of the disk array apparatus to a fixed value, such a disk array apparatus will be highly integrated necessarily.

In general, the disk array apparatus is air-cooled by an exhaust fan provided in a rack accommodating the disk modules therein. In this case, airflows are formed in gaps between the disk modules to remove heat from cabinet surfaces of the disk modules, thus lowering the temperature of the disk modules. Hence, in order to effectively air-cool the disk array apparatus, it is necessary to reduce duct resistance of air by widening the gaps, and thus to strengthen the airflows. This is a condition contradictory to high-density packaging in the disk array apparatus in which the gaps between the disk modules tend to be narrowed.

In order to solve such a contradiction in the above-described condition, for example, a method for enhancing a static pressure of the exhaust fan provided in the disk array apparatus is simple and easy. However, in the exhaust fan, the static pressure has an upper limit (for example, 25 mmAq) in general when the static pressure is enhanced while maintaining stable operation. Hence, the method is insufficient to solve the above-described contradiction.

Meanwhile, a method other than the method for enhancing the static pressure of the exhaust fan has also been adopted. For example, in a conventional disk array apparatus, in an empty space where a disk module is not plugged in, a member in the same shape as that of the disk module is provided. Alternatively, a partition plate for airflow is provided in a space portion between disk modules arranged up and down or arranged facing each other. Thus, the air in the space in the rack is prevented from stagnating, and a decline in airflow strength is controlled. See Japanese Patent Application Laid-Open Publication No. 2001-332078 for example.

However, only with contrivances for such a pseudo module, a partition plate and a draft passage as described above, the disk array apparatus in which the disk modules are packaged in high density cannot be sufficiently cooled. For a disk array apparatus having no empty space for a disk module, the pseudo module does not exert any special cooling effect. Moreover, the contrivances by means of the partition plate and the draft passage cause a necessity of widening the gaps between the disk modules. Hence, these contrivances cannot simultaneously satisfy the contradictory conditions, the high-density packaging in the disk array apparatus and the cooling thereof, while ensuring stable operation.

SUMMARY OF THE INVENTION

The present invention has been made in view of the problems described above. It is an object of the present invention to provide a disk module and a disk array apparatus.

Provided is a disk module in which a disk for recording information and a controller for controlling the operation of the disk are accommodated in a cabinet. The disk module is formed by providing a heat radiation member on at least one of two side faces of the cabinet, which are parallel to a recording surface of the disk.

Moreover, provided is a disk array apparatus including a plurality of disk boxes, each of which accommodates a plurality of the disk modules therein and has an inlet surface allowing air to flow in on one end side and an exhaust surface allowing the air out therefrom on the other end side; a rack which can accommodate the disk boxes therein in a stacking manner and of which surfaces facing the inlet surfaces of the disk boxes are capable of ventilation; and an exhaust fan which is arranged in the rack and causes the air to pass through the inlet and exhaust surfaces of the disk boxes and to flow through a draft passage inside the rack to the outside of the rack. The disk array apparatus is formed by providing a heat radiation member on at least one of the two side faces of the cabinet of each disk module, which are parallel to the recording surface of the disk.

Other problems and solving methods thereof, which are disclosed in this application, will be made clear by the section of the detailed description of the invention and the drawings.

According to the present invention, the disk module and the disk array apparatus can be provided.

Features and objects of the present invention other than the above will become clear by reading the description of the present specification with reference to the accompanying drawings.

BRIEF DESCRIPTION OF THE DRAWINGS

For amore complete understanding of the present invention and the advantages thereof, reference is now made to the following description taken in conjunction with the accompanying drawings wherein:

FIGS. 1A and 1B are views showing a disk array apparatus in this embodiment: FIG. 1A is a front view; and FIG. 1B is a side view;

DETAILED DESCRIPTION OF THE INVENTION

Figure 2:
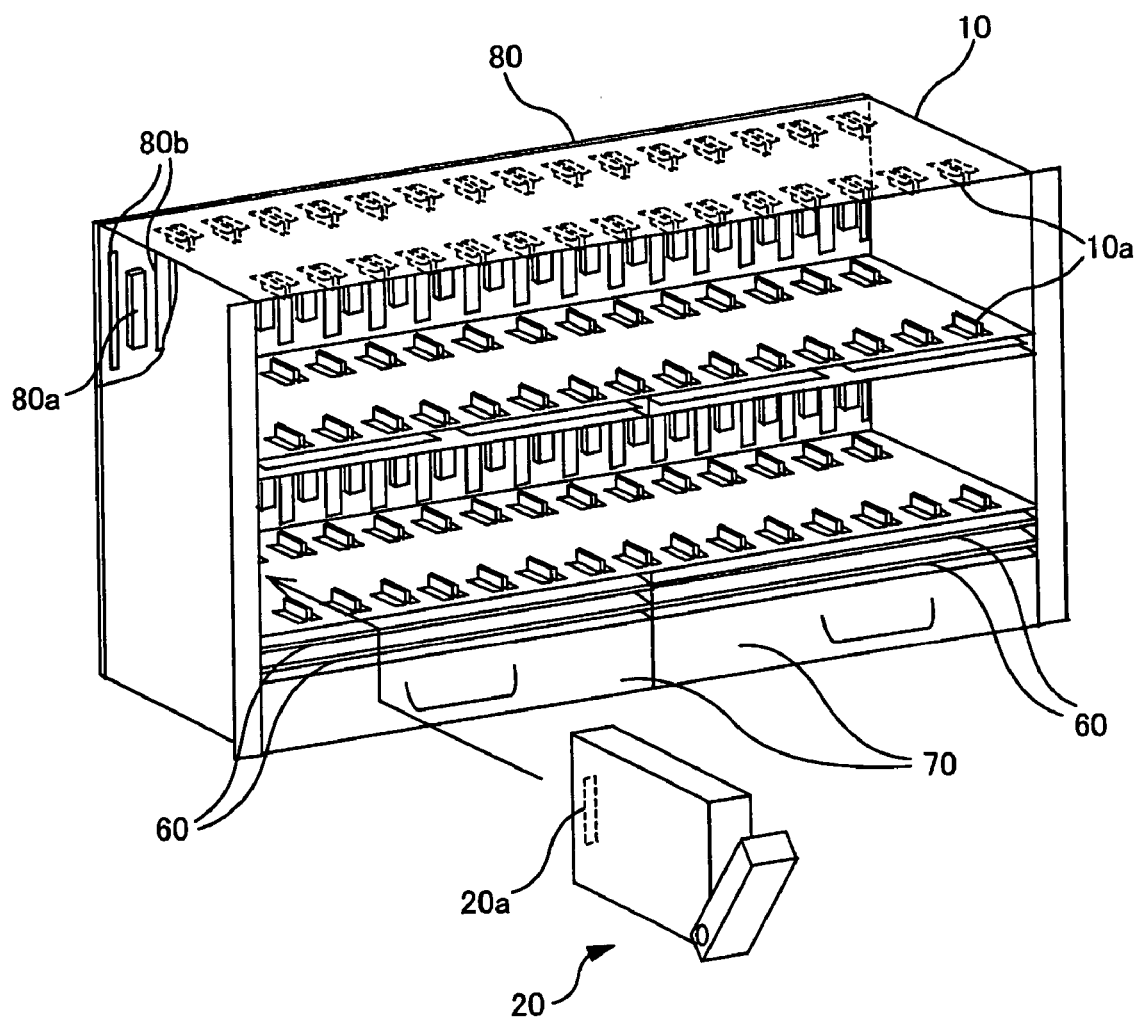
FIG. 2 is a perspective view of a disk box of a disk array apparatus in a first embodiment.

At least the following matters will be made clear by the following disclosure.

Summary of the Disclosure

According to the disk module as described above, for example, heat generated in the cabinet thereof due to the rotation of the disk and electric resistance of the controller is absorbed by the heat radiation member through a cabinet surface and discharged into the air in the periphery of the cabinet. That is, cooling of the disk module is accelerated by the air as a heat bath. Hence, the disk module including the heat radiation member can be sufficiently cooled even by a weaker airflow as compared with a disk module including no heat radiation member. Accordingly, even in air having a flow rate limited to a fixed value, overheating of the disk module can be suppressed, thus making it possible to ensure stable operation.

Moreover, the heat radiation member may be a plate-shaped member, and may be arranged on the side face of the cabinet.

In general, in the plate-shaped member, a shape thereof is adjusted to increase a ratio of a surface area to a volume, thus making it possible to enhance efficiency of heat absorption and discharge. Hence, the plate-shaped member of the disk module can absorb the heat inside the cabinet through the cabinet surface and effectively discharge the heat into the air in the periphery of the cabinet. Thus, even in the air having the flow rate limited to a fixed value, overheating of the disk module can be suppressed, thus making it possible to ensure stable operation.

Moreover, the heat radiation member may be a thermal conductive sheet, and may be arranged on the side face of the cabinet.

For example, the airflow hits part of the thermal conductive sheet to cool the part. Thus, even if ununiform temperature distribution occurs in the sheet, this temperature distribution is rapidly uniformed due to a high thermal conductive effect. Specifically, local heat generated in the disk module propagates to the part of the thermal conductive sheet, which is exposed to the airflow, and is discharged into the air. Hence, even in the air having the flow rate limited to a fixed value, overheating of the disk module can be suppressed, thus making it possible to ensure stable operation.

Moreover, the heat radiation member may be a plate-shaped member one surface of which is covered with the thermal conductive sheet, and the other surface of the plate-shaped member may be arranged on the side face of the cabinet.

According to the disk module as described above, even in the air having the flow rate limited to a fixed value, overheating of the disk module can be suppressed more effectively, thus making it possible to ensure stable operation more effectively.

Moreover, the thermal conductive sheet may have electric insulation properties.

According to this disk module, for example, when a plurality of the disk modules are arranged such that side faces thereof parallel to the recording surfaces of the disks face each other, the thermal conductive sheets can be interposed between the side faces. Hence, due to the electric insulation properties of the sheet, it is made possible to restrict electromagnetic interference between the controllers provided in the disk modules adjacent to each other.

According to the disk array apparatus as described above, even in the air having the flow rate limited to a fixed value, overheating of the disk module included in the disk array apparatus can be suppressed, thus making it possible to ensure stable operation. Hence, for example, even if the airflow in the gaps is weakened by narrowing the gaps between the disk modules, the disk modules can be sufficiently cooled, and the operation thereof can be stabilized. In other words, while ensuring the stable operation of the disk array apparatus, the high-density packaging therein is made possible.

Moreover, an exhaust port may be provided at a position facing an end of the heat radiation member, on the exhaust surface of the disk box.

According to the disk array apparatus as described above, the air flowing through the disk box hits the end of the heat radiation member, absorbs heat therefrom, and passes through the exhaust port. Then, the air flows through the draft passage to reach the outside of the rack without stagnating. In this way, the heat can be effectively discharged to the outside of the disk array apparatus.

Moreover, the end of the heat radiation member may protrude from the exhaust port provided in the exhaust surface of the disk box, and may be exposed to the draft passage. Duct resistance of the draft passage is relatively small in the rack, and therefore, the end of the heat radiation member, which is exposed to the draft passage, is effectively cooled by the air flowing through the draft passage. With this cooling, heat at a high-temperature region in the disk module included in the disk array apparatus propagates to the end. In this way, the high-temperature region can also be effectively cooled. Hence, it is made possible to cool the disk array apparatus.

Moreover, the heat radiation member may be a plate-shaped member, and may be arranged on the side face of the cabinet.

It is made possible to cool a disk array apparatus configured of a disk module including such a plate-shaped member.

Furthermore, the heat radiation member may be a thermal conductive sheet, and may be arranged on the side face of the cabinet.

It is made possible to cool a disk array apparatus configured of a disk module including such a thermal conductive sheet.

Moreover, the heat radiation member may be a plate-shaped member one surface of which is covered with the thermal conductive sheet, and the other surface of the plate-shaped member may be arranged on the side face of the cabinet.

It is made possible to cool a disk array apparatus configured of a disk module including such a heat radiation member more effectively.

Furthermore, the thermal conductive sheet may have electric insulation properties.

It is made possible to implement high-density packaging more effectively in a disk array apparatus configured of a disk module including such a thermal conductive sheet.

Moreover, the disk module accommodated in a portion far from the exhaust fan may include the heat radiation member having a larger area protruding from the exhaust port to the draft passage as compared with that of the heat radiation member of the disk module accommodated in a portion close to the exhaust fan.

The longer the distance from the exhaust fan is, the weaker the airflow in the draft passage becomes. Therefore, a heat radiation amount of the disk module accommodated in the portion far from the exhaust fan is lowered as compared with that of the disk module accommodated in the portion close to the exhaust fan. Accordingly, temperature differences among the disk modules occur depending on accommodation places thereof in the disk array apparatus. Eventually, there occur differences in operating performance and lifetime among the disk modules depending on the accommodation places in the disk array apparatus.

Then, the disk module accommodated in the portion far from the exhaust fan may include the heat radiation member having a larger area protruding from the exhaust port to the draft passage as compared with that of the heat radiation member of the disk module accommodated in the portion close to the exhaust fan.

Thus, although the airflow in the draft passage is weaker, the disk module accommodated in the portion far from the exhaust fan is cooled to a temperature equivalent to that of the disk module accommodated in the portion close to the exhaust fan. Hence, the temperature differences among the disk modules in the disk array apparatus are reduced, thus making it possible to reduce the differences in operating performance and lifetime among the disk modules.

Furthermore, the disk module accommodated in the portion far from the exhaust fan may include the heat radiation member with higher thermal conductivity as compared with that of the heat radiation member of the disk module accommodated in the portion close to the exhaust fan.

Thus, although a blast volume in the draft passage is smaller, the disk module accommodated in the portion far from the exhaust fan is cooled to a temperature equivalent to that of the disk module accommodated in the portion close to the exhaust fan. Hence, the temperature differences among the disk modules in the disk array apparatus are reduced, thus making it possible to reduce the differences in operating performance and lifetime among the disk modules.

By changing the area or the material of the heat radiation member as described above, the temperature differences among the disk modules in the disk array apparatus can be solved. However, if the area or the material of the heat radiation member is changed for each disk module, a manufacturing process of the disk modules is not standardized, leading to a possibility of increasing the manufacturing costs of the disk modules.

Then, the disk box may include an exhaust port provided on the exhaust surface and a heat radiation plate protruding from the exhaust port to the draft passage, and the heat radiation plate and the heat radiation member of the disk module may be brought into contact with each other. Furthermore, the disk box accommodated in the portion far from the exhaust fan may include the heat radiation plate having a larger area protruding from the exhaust port to the draft passage as compared with that of the heat radiation plate of the disk box accommodated in the portion close to the exhaust fan.

The heat of the heat radiation member of the disk module is transmitted to the heat radiation plate of the disk box, and the disk module is cooled by the air flowing through the draft passage. The area protruding to the draft passage, of the heat radiation plate of the disk box accommodated in the portion far from the exhaust fan is enlarged. Thus, it is made possible to enhance the effect of the cooling. Accordingly, the temperature differences among the disk modules in the disk array apparatus are reduced, thus making it possible to reduce the differences in operating performance and lifetime among the disk modules. Moreover, the configuration of the disk modules is standardized in the disk array apparatus. That is, as compared with the case of changing the area or the material of the heat radiation member for each disk module, it is made possible to suppress the manufacturing costs of the disk modules.

Moreover, the disk box accommodated in the portion far from the exhaust fan may include the heat radiation plate with higher thermal conductivity as compared with that of the heat radiation plate of the disk box accommodated in the portion close to the exhaust fan.

Thus, a cooling effect for the disk module accommodated in the portion far from the exhaust fan can be enhanced. The temperature differences among the disk modules in the disk array apparatus are reduced, and it is made possible to reduce the differences in operating performance and lifetime among the disk modules. Moreover, the configuration of the disk modules is standardized in the disk array apparatus. That is, as compared with the case of changing the area or the material of the heat radiation member for each disk module, it is made possible to restrict the manufacturing costs of the disk modules.

First Embodiment

First, a first embodiment in which the heat radiation member is provided in the disk module is described.

<<Configuration (1) of Disk Module and Disk Array Apparatus>>

A configuration of a disk array apparatus in this embodiment is described.

FIG. 1A is a front view of a disk array apparatus 1, and FIG. 1B is a side view thereof. The disk array apparatus 1 is mainly formed by including eight disk boxes 10 in total.

Each of the disk boxes 10 accommodates disk modules 20 therein, supplies electric power to the disk modules 20, and controls electrical information of the disk modules 20. Two of the disk boxes 10 maintain a gap therebetween while opposing back surfaces (exhaust surfaces 103) thereof to each other and are symmetrically arranged as shown in FIG. 1B to form a unit 30. Four such units 30 are arranged up and down in four stages. The above-described gaps, with respect to these units 30 in four stages, collectively form a draft passage 30a. Undermentioned metal plates 22 and thermal conductive sheets 23 for cooling the disk modules 20 protrude into the draft passage 30a (heat radiation members), and protruding areas thereof become larger as they are located in a lower portion of a rack 50 as shown in FIG. 1B. Above the unit 30 located on the uppermost stage, eight electric exhaust fans 35 in total are provided so as to bridge over upper surfaces of the two disk boxes 10. Below the units 30 in four stages, two power supply sections 40 are arranged, which distribute AC power to undermentioned power supplies in the disk boxes 10 and to the exhaust fans 35. Specifically, in the rack 50, the units 30 in four stages, the exhaust fans 35 and the two power supply sections 40 are accommodated. The rack 50 is a standard one of which a front surface 103 facing inlet surfaces 101 of the disk boxes 10, is 19 inches in width. On each of the two front surfaces 103 of the rack 50, a louvered door provided with a filter therein is provided, and on an upper surface orthogonal to the front surfaces, a ceiling surface 50c enabling ventilation is provided.

FIG. 2 is a perspective view of the disk box 10. The disk box 10 takes in thirty-two disk modules 20 from a front surface thereof to accommodate sixteen disk modules 20 each on an upper stage and on a lower stage thereof using a plug-in system. Below the disk modules 20, the disk box 10 includes four control circuit boards 60 each of which controls eight of the disk modules 20, and further below these boards, two power supplies 70 which drive the disk modules 20 and the control circuit boards 60. On a back surface board 80 forming a back surface of the disk box 10, connectors 80a are provided. The connectors 80a are connected to connectors 20a of the disk modules 20 mechanically and electrically, thus achieving plugging in of the modules. Moreover, the control circuit boards 60, the power supplies 70, and an interface cable are electrically connected to the back surface board 80. Thus, electric power is supplied to each disk module 20 and the control circuit boards 60. Further, the disk modules 20 are electrically connected to a high-order host computer through the above-mentioned interface cable, and the electrical information is transferred between the modules and the computer. Furthermore, the disk modules 20 are of a portable type, and upper and lower portions of each are formed in a structure engaging with guides 10a provided on the disk box 10. Thus, the disk modules 20 are attached to/detached from the disk box 10 along the guides 10a. Gaps between the sixteen disk modules 20 arrayed in line are preferably 2 to 3 mm each, and these gaps forms the inlet surface of the disk box 10.

Specifically, in this embodiment, eight disk boxes 10 are accommodated in one rack 50, and thirty-two disk modules 20 are accommodated in each disk box 10. Therefore, as a whole, two hundred fifty-six (256) disk modules 20 are accommodated in one rack 50.

Figure 3:
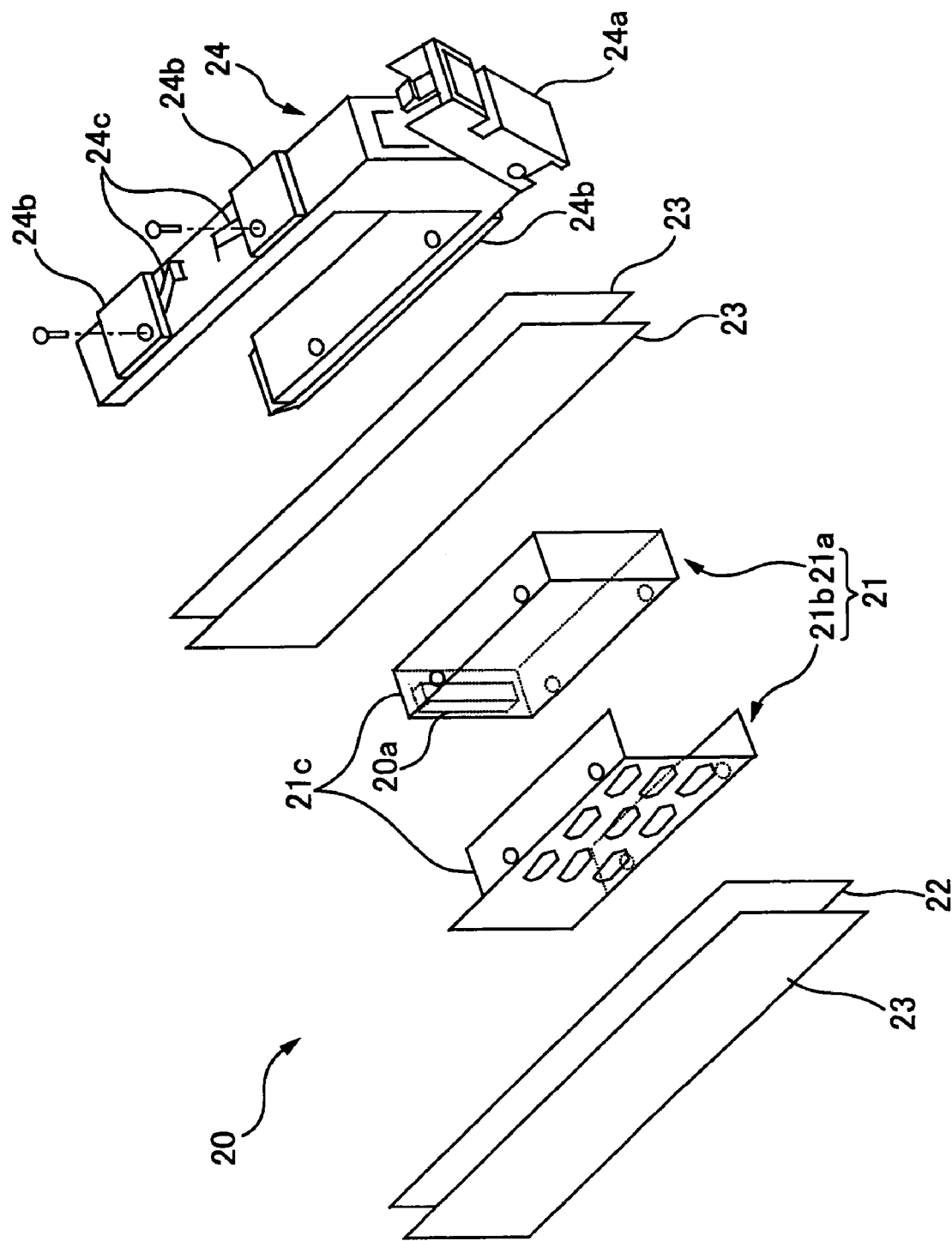
FIG. 3 is an exploded perspective view of a disk module in the first embodiment.

FIG. 3 is an exploded perspective view of the disk module 20. In this embodiment, the disk module 20 is a magnetic disk device. The disk module 20 includes a magnetic disk device body 21 accommodated in a cabinet 21c, metal plates (plate-shaped members) 22 in intimate contact with the cabinet 21c, thermal conductive sheets 23 which cover these metal plates 22, and a canister 24 which supports the magnetic disk device body 21 formed in the cabinet 21c in intimate contact with the metal plates 22 covered with the thermal conductive sheets 23. The magnetic disk device body 21 includes a magnetic disk device portion 21a, and a protection fixing 21b in which a plurality of holes are drilled through a surface. The body 21 mainly includes, in the cabinet 21c, the following constituents. Specifically, the constituents are a disk which records information, a head which records/reads the information to/from the disk, an actuator which controls the head, and an electronic circuit section (controller) which performs control of movement and positioning of the head, control of rotation of the disk, processing of the information, and transfer of the information with a high-order host computer. Moreover, the disk is rotated by a motor through a spindle at high speed. Furthermore, the disk in the magnetic disk device portion 21a is arranged such that the recording surface thereof becomes parallel to right and left side faces of the device portion 21a in FIG. 3.

The rectangular metal plates 22 are brought into intimate contact with right and left side faces of the cabinet 21c in FIG. 3. One of the metal plates 22 is adhered onto a surface of the protection fixing 21b forming the left side face of the cabinet 21c by means of a thermal conductive adhesive. The other metal plate 22 is screwed to the right side face. The length of the two metal plates 22 along a vertical direction in FIG. 3 is equal to the length of the cabinet 21c along the vertical direction. Moreover, each of the metal plates 22 is fixed such that upper and lower end surfaces thereof coincides with upper and lower surfaces of the cabinet 21c, respectively. Furthermore, the metal plates 22 are fixed such that ends thereof on a back surface side are extended from the side faces of the cabinet 21c. As material of the metal plates 22, aluminum, copper, SUS and the like are preferable. On outer side faces of the two metal plates 22, the thermal conductive sheets 23 formed in the same shape as that of the metal plates 22 are adhered by means of a silicon adhesive resistant to 250° C. so as to cover the metal plates 22 entirely. For the thermal conductive sheets 23 in this embodiment, copper sheets of which the entire surfaces are coated with insulator are adopted.

The magnetic disk device body 21 including the metal plates 22 and the thermal conductive sheets 23 is screwed to the canister 24 and supported thereby. The canister 24 includes a manipulation handle portion 24a for plug-in operation on a front surface side, and insulating spacers 24b on upper and lower sides. Moreover, on the upper surface, springs 24c for fixing the disk module 20 into the disk box 10 are provided.

Figure 4:
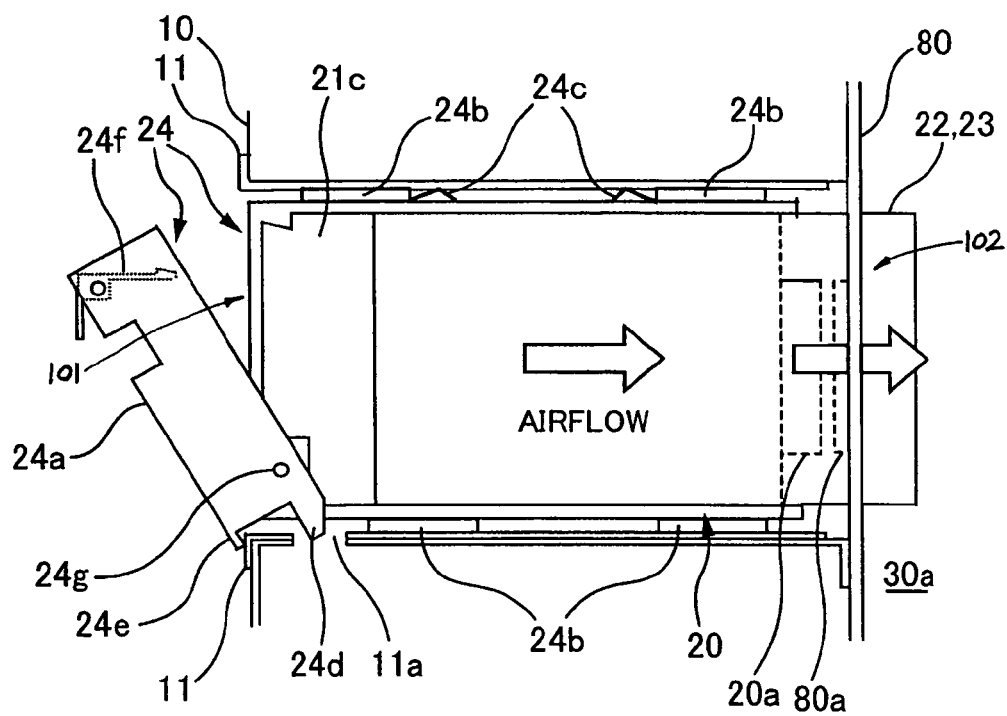
FIG. 4 is a view showing a side face of the disk module and a cross section of the disk box in the first embodiment.

FIG. 4 shows the side face of the disk module 20 and a cross section of the disk box 10 immediately before the disk module 20 is inserted into the disk box 10 or immediately after the disk module 20 is extracted from the disk box 10. Shock absorbing materials 11 are provided on the upper and lower inner surfaces of the disk box 10 in FIG. 4. The insulating spacers 24b and the springs 24c on the upper and lower surfaces of the canister 24 abut onto these shock absorbing materials 11, and the upper and lower surfaces of the canister 24 engage with the guides 10a. Thus, the disk module 20 can move in the disk box 10 along a plug-in direction.

The manipulation handle portion 24a of the canister 24 includes two types of cam portions 24d and 24e, a latch portion 24f, and a shaft portion 24g. The manipulation handle portion 24a is rotatable by approximately 90° about the shaft portion 24g. When the canister 24 is inserted, the manipulation handle portion 24a is rotated from a state of being horizontally laid to a state of being vertically erected in FIG. 4. In such a way, the cam portion 24d engages with a cam receiving hole 11a formed in a region of the lower shock absorbing material 11, the region being closer to the front surface of the disk box 10. Then, by means of leverage, the connector 20a of the disk module 20 and the connector 80a of the back surface board 80 are coupled to each other. On the other hand, when the canister 24 is extracted, the manipulation handle portion 24a is rotated from the state of being vertically erected to the state of being horizontally laid in FIG. 4. In such a way, the cam portion 24e abuts on a front surface region of the lower shock absorbing material 11, and by means of the leverage, the connector 20a of the disk module 20 and the connector 80a of the back surface board 80 are separated from each other. Note that the manipulation handle portion 24a is fixed to the canister 24 by the latch portion 24f.

Figure 5:
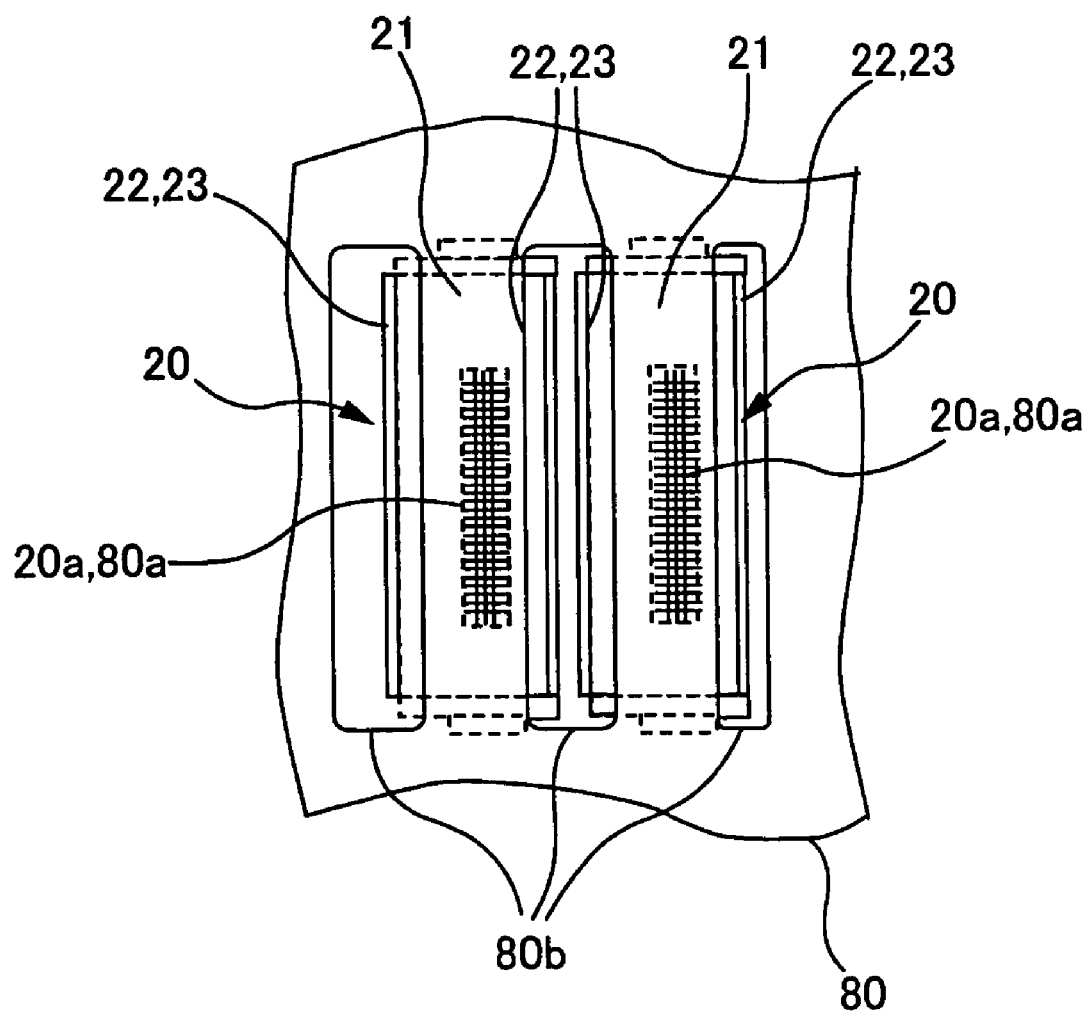
FIG. 5 is a view of part of a back surface board of the disk box of the disk array apparatus in the first embodiment, viewed from a back surface side.

As shown in FIG. 4, the metal plates 22 onto which the thermal conductive sheets 23 are adhered are brought into intimate contact with both the side faces of the cabinet 21c for the magnetic disk device body 21 in such a manner of not overlapping with the manipulation handle portion 24a on the front surface side in the plug-in direction. Moreover, the metal plates 22 onto which the thermal conductive sheets 23 are adhered are extended to the draft passage 30a from the back surface portion in the plug-in direction. Furthermore, as shown in FIG. 5, exhaust ports 80b are drilled through the back surface board 80 of the disk box 10 so as to surround portions protruding to the draft passage 30a, of the metal plates 22 onto which the thermal conductive sheets 23 are adhered. FIG. 5 is a view of part of the back surface board 80, viewed from the back surface side. The magnetic disk device body 21 has a sandwich structure of being sandwiched between the pair of metal plates 22 onto which the thermal conductive sheets 23 are adhered.

<<Cooling Operation (1) for Disk Module and Disk Array Apparatus>>

Cooling operation for the disk array apparatus 1 having the foregoing structure is described.

In FIGS. 1B and 4, directions of airflows while the exhaust fans 35 are being operated are schematically shown by arrows. When the exhaust fans 35 are activated, the air outside the rack 50 passes through the louvers and filters of the front doors of the rack 50 and flows into the gaps defined between the disk modules 20. This air flows from the front surface (inlet ventilating surface 101) of the disk box 10 to the back surface (exhaust ventilating surface 102) thereof while colliding with the surfaces of the thermal conductive sheets 23 on the side surfaces of the disk modules 20. In this process, heat on the side faces of the thermal conductive sheets 23 is dissipated into the air. Meanwhile, during the operation of the disk array apparatus 1, for example, frictional heat due to the rotation of the disks, resistance heat of the electronic circuit sections and the like are generated inside the magnetic disk device bodies 21. The heat propagates to the thermal conductive sheets 23 from the insides of the magnetic disk device bodies 21 through the cabinets 21c and the metal plates 22. Hence, the heat inside the bodies 21 is discharged into the air through the thermal conductive sheets 23.

The air having flowed along the side faces of the disk modules 20 passes through the exhaust ports 80b of the back surface board 80 of each disk box 10 and flows into the draft passage 30a. Then, the air flows in the draft passage 30a toward the exhaust fans 35 located on the upper portion of the rack 50. In this embodiment, a duct resistance of the draft passage 30a is the smallest as compared with those of the other regions in the rack 50, and accordingly, the airflow in the draft passage 30a is the strongest. Consequently, this strong airflow effectively cools the ends exposed to the draft passage 30a, of the metal plates 22 onto which the thermal conductive sheets 23 are adhered. Then, when there occur temperature differences between the cooled ends and high-temperature regions in intimate contact with the cabinets 21c, this temperature distribution is rapidly uniformed due to the thermal conductivity of the thermal conductive sheets 23.

Here, during the operation of the exhaust fans 35, the airflow collides with the ends described above, and the ends continue to be cooled. Simultaneously, in the thermal conductive sheets 23 and the metal plates 22, the temperature distribution caused by the cooling described above continues to be uniformed due to the thermal conductivity of the thermal conductive sheets 23. Specifically, the heat generated from the high-temperature regions inside the bodies 21 propagates to the ends that are low-temperature regions, and is discharged into the air flowing in the draft passage 30a.

In this embodiment, it is possible to efficiently cool the disk modules 20 included in the disk array apparatus 1. Because of the thermal radiation properties and the thermal conductivity of the metal plates 22 onto which the thermal conductive sheets 23 are adhered, when cooling the disk modules 20 having the metal plates 22, the flow rate of the air flowing in the rack 50 can be saved to be weaker than when cooling disk modules without the metal plates 22 provided. Hence, it is possible to reduce the gaps between the disk modules 20 to approximately 2 to 3 mm, and to package sixteen disk modules 20 arrayed in line in the standard rack 50 with the width of 19 inches.

Moreover, even if the gaps between the disk modules 20 are reduced, electromagnetic interference such as eddy currents among the electronic circuit sections in the disk modules 20 adjacent to one another can be avoided due to the electric insulation properties of the thermal conductive sheets 23. Hence, malfunction of the disk array apparatus 1 can be avoided.

According to this embodiment in which the metal plates 22 onto which the thermal conductive sheets 23 are adhered are brought into intimate contact with the side faces of the cabinets 21c, the plurality of disk modules 20 adjacent to one another through the narrow gaps can be efficiently cooled while avoiding the mutual electromagnetic interference. Hence, the high-density packaging can be implemented in the disk array apparatus 1.

Moreover, by increasing the areas protruding to the draft passage 30a, of the ends of the metal plates 22 and thermal conductive sheets 23, it is made possible to enhance a cooling effect by the air flowing through the draft passage 30a. In this embodiment, the exhaust fans 35 are arranged in the upper portion of the rack 50, and the airflow in the draft passage 30a becomes weaker from the upper portion of the rack 50 to the lower portion thereof. However, the metal sheets 22 and the thermal conductive sheets 23 are arranged in the disk modules 20 such that the areas of the ends protruding to the draft passage 30a become larger as the ends are located lower in the rack 50. Therefore, even in the lower portion of the rack 50, a cooling effect equivalent to that in the upper portion of the rack 50 can be obtained.

Second Embodiment

Next, a second embodiment in which heat radiation plates are provided in a disk box is described.

<<Configuration (2) of Disk Module and Disk Array Apparatus>>

A configuration of a disk array apparatus in the second embodiment is described.

The entire configuration of the disk array apparatus is the same as that of the first embodiment, and is shown in the front view of FIG. 1A and in the side view of FIG. 1B. However, in FIG. 1B, it is not the metal plates 22 and the thermal conductive sheets 23 but heat sinks 601 to be described later that protrude to the draft passage 30a.

Figure 6:
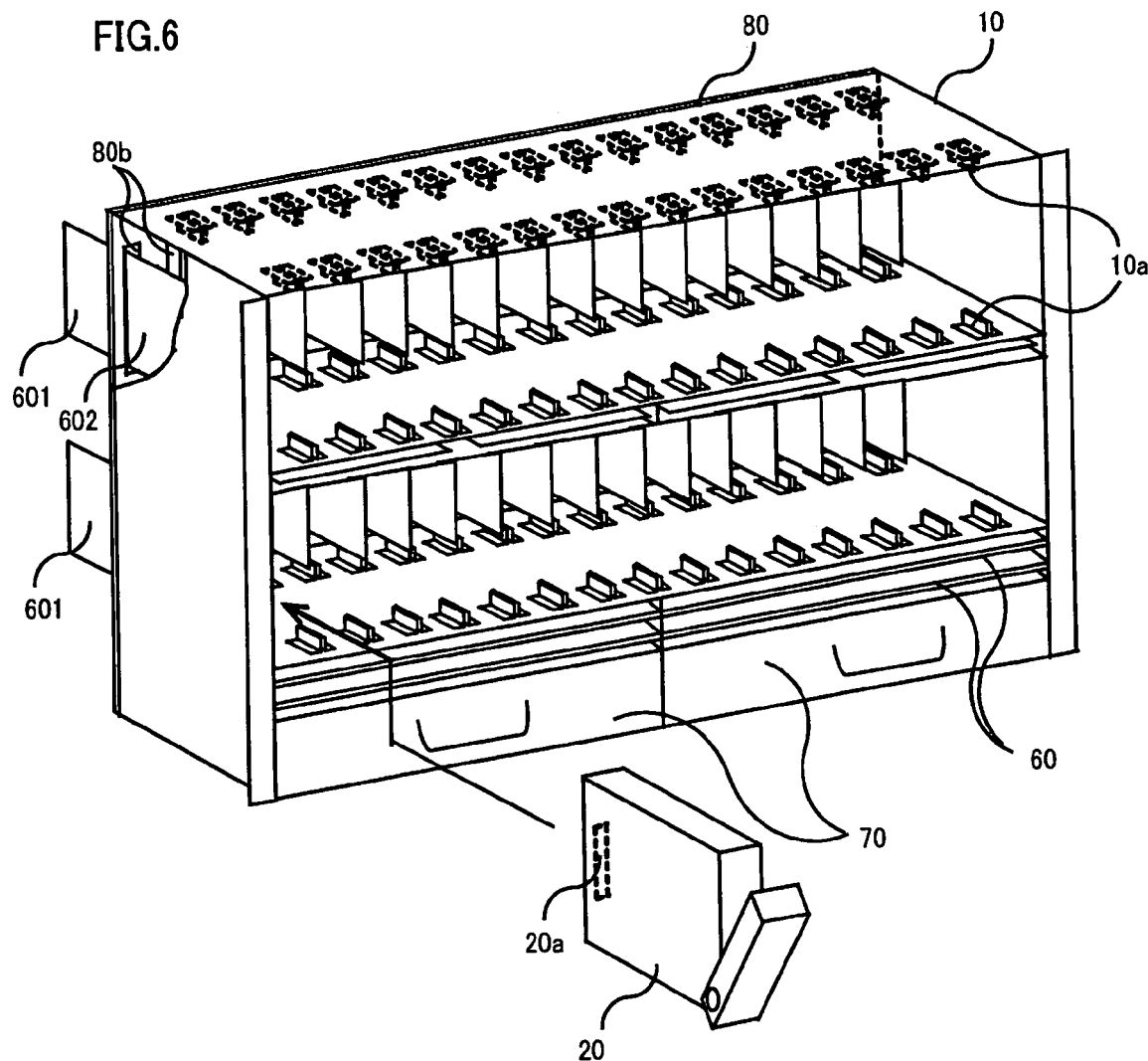
FIG. 6 is a perspective view of a disk box of a disk array apparatus in a second embodiment.

FIG. 6 is a perspective view of the disk box 10. A difference in configuration from the disk box 10 in the first embodiment is only that the heat sinks 601 as the heat radiation plates are arranged on the back surface board 80 of the disk box 10. The heat sinks 601 are arranged so as to penetrate through the exhaust ports 80b, and include disk module contact portions 602 inside the disk box 10. For material of the heat sinks 601, iron, aluminum, copper and the like are preferable. In this embodiment, aluminum is used as the material of the heat sinks 601. Moreover, the heat sinks 601 are arranged in the disk boxes 10 such that areas of portions protruding to the draft passage 30a become larger from the upper portion of the rack 50 to the lower portion thereof.

Figure 7:
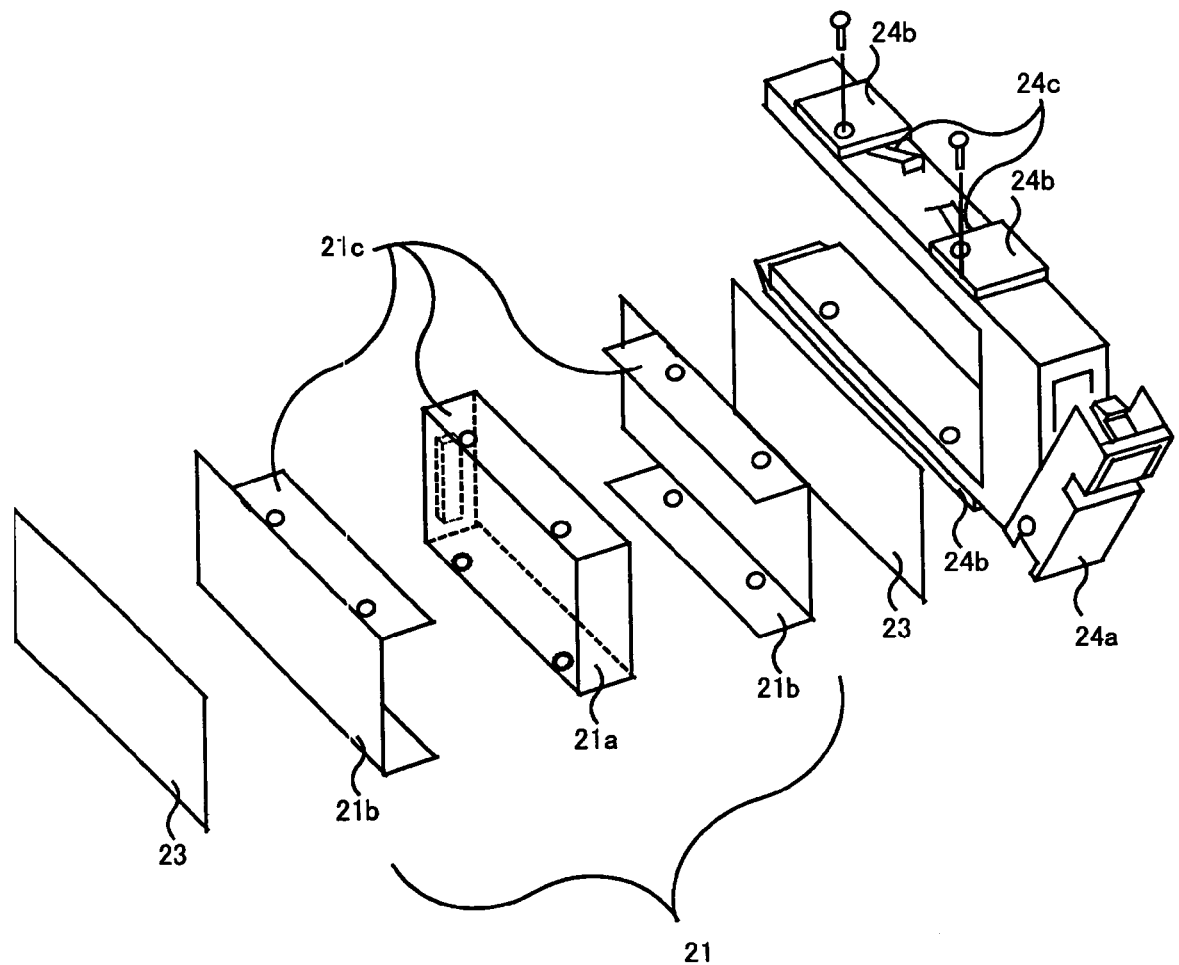
FIG. 7 is an exploded perspective view of a disk module in the second embodiment.

FIG. 7 is an exploded perspective view of the disk module 20 in the second embodiment. The disk module 20 includes the magnetic disk device body 21 accommodated in the cabinet 21c, the thermal conductive sheets 23 brought into intimate contact with the side faces of the magnetic disk device body 21, and the canister 24 which supports the magnetic disk device body 21. The magnetic disk device body 21 includes the magnetic disk device portion 21a, and the protection fixings 21b in which a plurality of holes are drilled through surfaces. Constituents which the magnetic disk device body 21 includes in the cabinet 21c are the same as those of the first embodiment.

On outer side faces of the protection fixings 21b of the cabinet 21c, the thermal conductive sheets 23 formed in the same shape as that of these side faces are adhered by means of a silicon adhesive resistant to 250° C. so as to cover the outer side faces of the protection fixings 21b entirely. For material of the thermal conductive sheets 23, copper, silicon resin and the like are preferable. In this embodiment, adopted are copper sheets of which the entire surfaces are coated with insulator.

The magnetic disk device body 21 is supported by the canister 24 in the same manner as in the first-embodiment.

Figure 8:
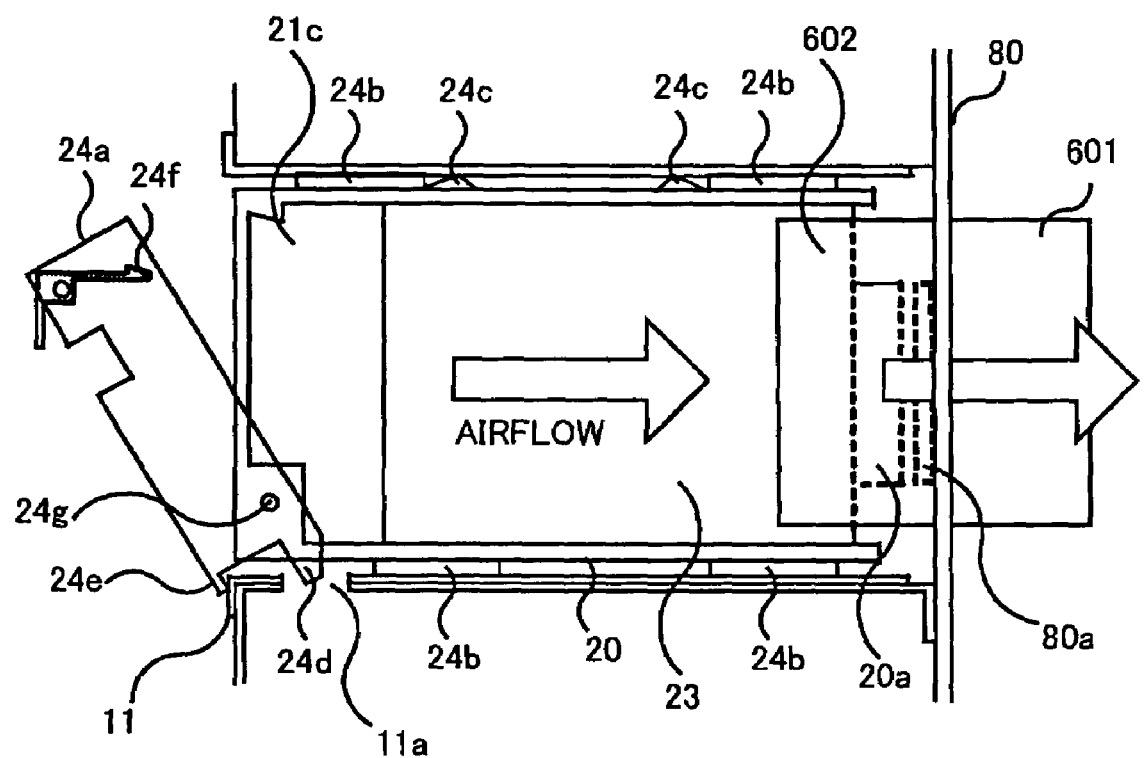
FIG. 8 is a view showing a side face of the disk module and a cross section of the disk box in the second embodiment.

FIG. 8 shows the side face of the disk module 20 and a cross section of the disk box 10 immediately before the disk module 20 is inserted into the disk box 10 or immediately after the disk module 20 is extracted from the disk box 10. A difference from the first embodiment is only that the heat sinks 601 are arranged on the back surface board 80 of the disk box 10 and that the thermal conductive sheets 23 are brought into contact with the disk module contact portions 602 of the heat sinks 601.

Figure 9:
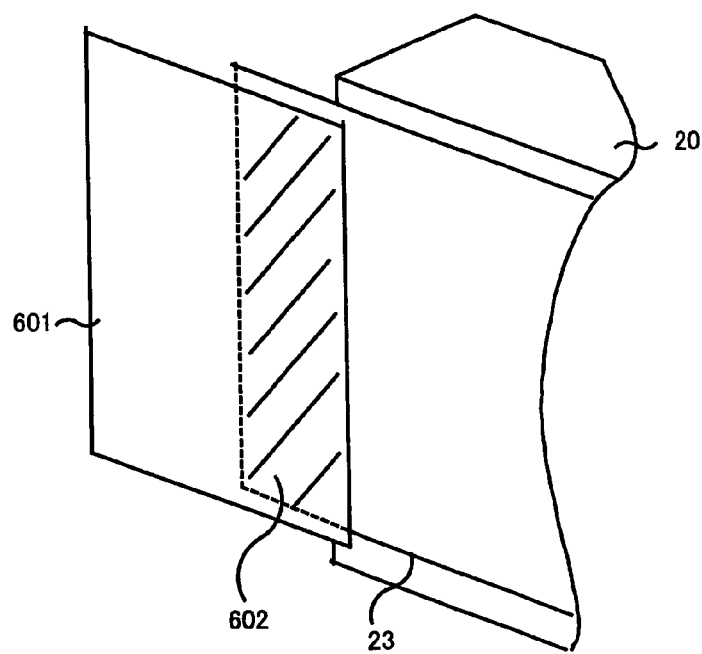
FIG. 9 is a first perspective view showing a contact portion of a heat sink and a thermal conductive sheet in the second embodiment.
Figure 10:
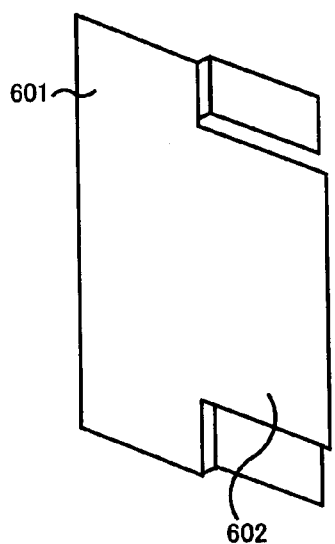
FIG. 10 is a perspective view showing a shape of the heat sink in the second embodiment.
Figure 11:
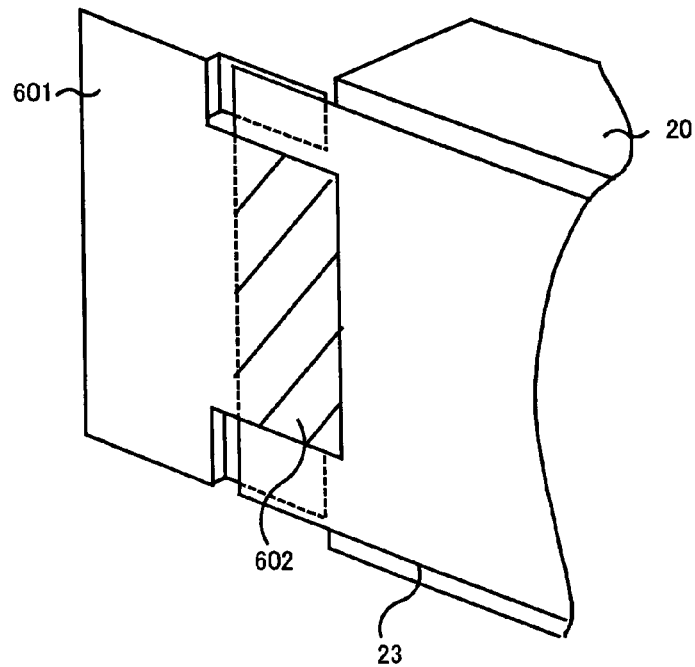
FIG. 11 is a second perspective view showing a contact portion of the heat sink and the thermal conductive sheet in the second embodiment.

The disk module contact portion 602 of the heat sink 601 is, for example, planar as shown in FIG. 9, and brought into contact with an end portion of the thermal conductive sheet 23. Moreover, as shown in FIG. 10, upper and lower ends of the disk module contact portion 602 of the heat sink 601 may be folded. In this case, as shown in FIG. 11, the thermal conductive sheet 23 is brought into contact with the disk module contact portion 602 so as to be held thereby.

Figure 12:
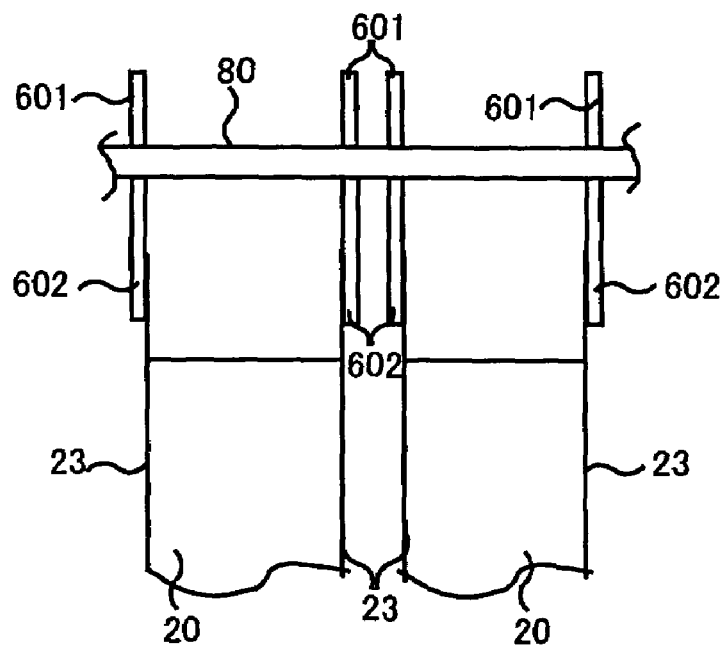
FIG. 12 is a view showing a first arrangement example of the heat sinks in the second embodiment.
Figure 13:
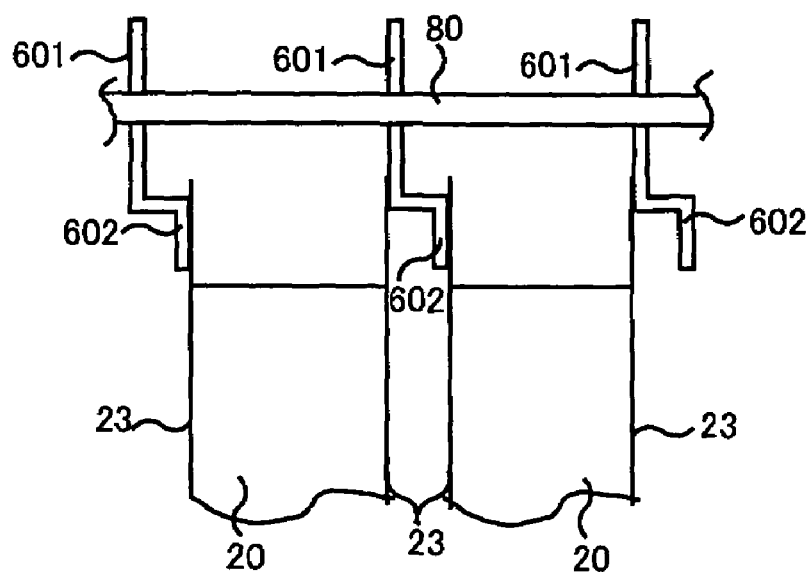
FIG. 13 is a view showing a second arrangement example of the heat sinks in the second embodiment.

FIGS. 12 and 13 are views showing arrangement examples of the heat sinks 601. In FIG. 12, two heat sinks 601 are provided for each disk module 20. That is, one thermal conductive sheet 23 is in contact with one heat sink 601. Moreover, as shown in FIG. 13, each disk module contact portion 602 of the heat sink 601 may be bent so as to be brought into contact with mutually facing thermal conductive sheets 23 of two disk modules 20 adjacent to each other.

Figure 14:
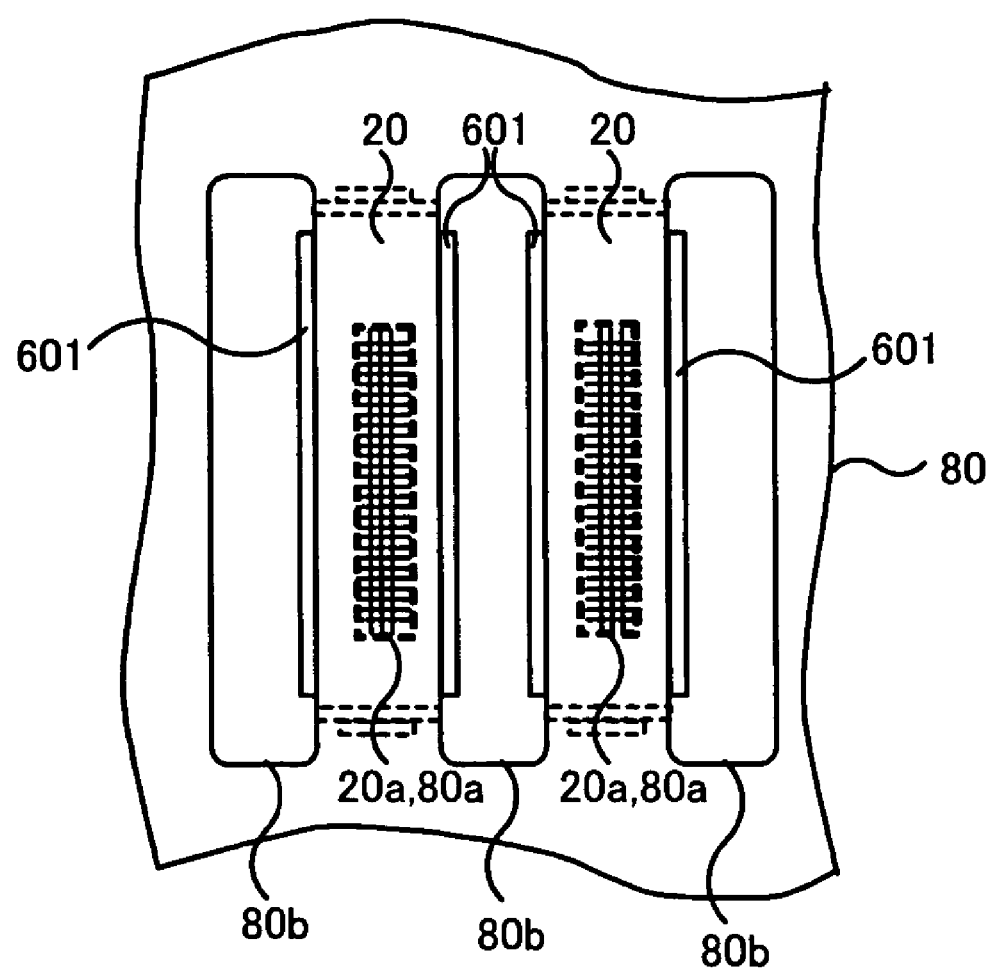
FIG. 14 is a view showing part of a back surface board of the disk box of the disk array apparatus in the second embodiment, viewed from a back surface side.

FIG. 14 is a view showing part of the back surface board 80 in the case of arranging the heat sinks 601 as shown in FIG. 12, viewed from a draft passage 30a side. On the back surface board 80 of the disk box 10, the exhaust ports 80b are formed, and the heat sinks 601 are adhered onto both ends of each exhaust port 80b. The heat sinks 601 are brought into contact with the thermal conductive sheets 23 of the disk modules 20 inside the disk box 10.

<<Cooling Operation (2) for Disk Module and Disk Array Apparatus>>

Cooling operation for the disk array apparatus 1 having the foregoing structure is described.

In FIGS. 1B and 8, directions of airflows while the exhaust fans 35 are being operated are schematically shown by arrows. When the exhaust fans 35 are activated, the air outside the rack 50 passes through the louvers and filters of the front doors of the rack 50 and flows into the gaps defined between the disk modules 20. This air flows from the front surface of the disk box 10 to the back surface thereof while colliding with the surfaces of the thermal conductive sheets 23 on the side faces of the disk modules 20 and the surfaces of the heat sinks 601. In this process, heat on the surfaces of the thermal conductive sheets 23 and heat sinks 601 is discharged into the air. Meanwhile, during the operation of the disk array apparatus 1, for example, frictional heat due to the rotation of the disks, resistance heat of the electronic circuit sections and the like are generated inside the magnetic disk device bodies 21. The heat propagates to the thermal conductive sheets 23 from the insides of the magnetic disk device bodies 21 through the cabinets 21c. Furthermore, the heat of the thermal conductive sheets 23 propagates to the heat sinks 601. Hence, the heat from the insides of the bodies 21 is discharged into the air through the thermal conductive sheets 23 and the heat sinks 601.

The air having flowed along the side faces of the disk modules 20 passes through the exhaust ports 80b of the back surface board 80 of each disk box 10, and flows into the draft passage 30a. Then, this airflows in the draft passage 30a toward the exhaust fans 35 located on the upper portion of the rack 50. In this embodiment, duct resistance of the draft passage 30a is the smallest as compared with those of the other regions in the rack 50, and accordingly, the airflow in the draft passage 30a is the strongest. Consequently, this strong airflow effectively cools the ends protruding to the draft passage 30a, of the heat sinks 601. Then, when there occur temperature differences between the cooled ends and the disk module contact potions 602 in contact with the thermal conductive sheets 23 which are brought into intimate contact with the cabinets 21c, this temperature distribution is rapidly uniformed due to the thermal conductivity of the heat sinks 601 and thermal conductive sheets 23.

Moreover, by increasing the areas of the ends protruding to the draft passage 30a, of the heat sinks 601, it is made possible to enhance a cooling effect by the air flowing through the draft passage 30a. In this embodiment, the exhaust fans 35 are arranged in the upper portion of the rack 50, and the airflow in the draft passage 30a becomes weaker from the upper portion of the rack 50 to the lower portion thereof. However, the heat sinks 601 are arranged in the disk boxes 10 such that the areas of the ends protruding to the draft passage 30a become wider as the ends are located lower in the rack 50. Therefore, even in the lower portion of the rack 50, a cooling effect equivalent to that in the upper portion of the rack 50 can be obtained.

Here, during the operation of the exhaust fans 35, the airflow collides with the ends of the heat sinks 601 described above, and the ends continue to be cooled. Simultaneously, in the thermal conductive sheets 23 and the heat sinks 601, the temperature distribution caused by the cooling described above continues to be uniformed by the thermal conductivity of the thermal conductive sheets 23 and heat sinks 601. Specifically, the heat generated from the high-temperature regions inside the magnetic disk device bodies 21 propagates to the ends of the heat sinks 601 that are low-temperature regions, and is discharged into the air flowing in the draft passage 30a.

In this embodiment, it is possible to efficiently cool the disk modules 20 included in the disk array apparatus 1. Because of the thermal conductivity of the thermal conductive sheets 23 and heat sinks 601 of this embodiment, when cooling the disk modules 20 having the thermal conductive sheets 23 and the heat sinks 601, the flow rate of the air flowing in the rack 50 can be saved to be weaker than when cooling disk modules without the thermal conductive sheets 23 and the heat sinks 601 provided. Hence, it is possible to reduce the gaps between the disk modules 20 to approximately 2 to 3 mm, and to package sixteen disk modules 20 arrayed in line in the standard rack 50 with the width of 19 inches.

Moreover, even if the gaps between the disk modules 20 are reduced, electromagnetic interference such as eddy currents among the electronic circuit sections in the disk modules 20 adjacent to one another can be avoided due to the electric insulation properties of the thermal conductive sheets 23. Hence, malfunction of the disk array apparatus 1 can be avoided.

According to this embodiment in which the thermal conductive sheets 23 are brought into intimate contact with the side faces of the cabinets 21c, the plurality of disk modules 20 adjacent to one another through the narrow gaps can be efficiently cooled while avoiding the mutual electromagnetic interference. Hence, high-density packaging can be implemented in the disk array apparatus 1.

Moreover, equivalent cooling effects can be obtained in the upper and lower portions of the rack 50. Thus, the differences in operating performance and lifetime, which depend on differences in places where the disk modules 20 are accommodated in the disk array apparatus 1, can be reduced.

Furthermore, the areas of the portions protruding to the draft passage 30a, of the heat sinks 601 arranged in the disk boxes 10 are changed. Thus, uniforming of the cooling effects in the upper and lower portions of the rack 50 is realized. Accordingly, all of the disk modules 20 in the disk array apparatus 1 can adopt the same configuration. Therefore, as compared with the case of changing the areas protruding to the draft passage 30a, of the portions of the thermal conductive sheets 23 of the disk modules 20, the manufacturing costs of the disk modules 20 can be restricted.

Other Embodiments

The embodiments of the invention described above are ones for facilitating understanding of the present invention, and are not ones limiting the present invention. It is needless to say that alterations and improvements can be made for the present invention without departing from the spirit thereof and that the present invention includes correspondences thereof.

Although the metal plates 22 are brought into intimate contact with the side faces of the cabinets 21c for the magnetic disk device bodies 21 in the first embodiment, the present invention is not limited to this. For example, only the thermal conductive sheets 23 may be directly adhered onto the side faces of the cabinets 21c. However, it is preferable to provide the thermal conductive sheets 23 on the cabinets 21c with the metal plates 22 interposed therebetween. Thus, the thermal conductive sheets 23 are extended straight along the side faces of the cabinets 21c, thereby avoiding the thermal conductive sheets 23 being brought into contact with the exhaust ports 80b and the like. Hence, the disk modules 20 can be cooled more effectively.

Moreover, although the thermal conductive sheets 23 are adhered onto the surfaces of the metal plates 22 in the first embodiment, the present invention is not limited to this, and only the metal plates 22 may be provided. When the airflow collides with the ends exposed to the draft passage 30a, of the metal plates 22, heat is dissipated from the metal plates 22 into the air. Moreover, the ends of the metal plates 22 continue to be cooled, and the portions thereof brought into intimate contact with the cabinets 21 continue to be heated, whereby the temperature distribution is caused. This temperature distribution is solved by the thermal conductivity inherent in the metal plates 22. In other words, the heat in the high-temperature regions of the cabinets 21 propagates to the low-temperature regions of the ends of the metal plate 22, and is discharged into the air that collides with the ends. However, it is preferable to use the metal plates 22 onto which the thermal conductive sheets 23 are adhered. Thus, the temperature distribution described above can be solved more effectively because of the high thermal conductivity of the thermal conductive sheets 23.

Furthermore, although the thermal-conductive-sheets 23 have the electric insulation properties in the first embodiment, the present invention is not limited to this. For example, the thermal conductive sheets 23 may have electric conductivity. However, it is preferable that the thermal conductive sheets 23 have the electric insulation properties. Thus, the mutual electromagnetic interference among the electronic circuit sections in the disk modules 20 adjacent to one another can be avoided more effectively.

Moreover, although the exhaust ports 80b are drilled in the back surface boards 80 of the disk boxes 10 in the first embodiment, the present invention is not limited to this, and such ports may be eliminated. However, it is preferable to provide the exhaust ports 80b. Thus, the heat from the disk modules 20 can be discharged more effectively to the outside of the rack 50 by the airflow passing through these ports.

Furthermore, although the ends of the metal plates 22 onto which the thermal conductive sheets 23 are adhered protrude to the draft passage 30a in the first embodiment, the present invention is not limited to this, and the ends do not have to protrude. However, it is preferable to provide such protruding portions as described above. Thus, the heat of the disk modules 20 is discharged more effectively because the protruding portions are cooled by the strong airflow in the draft passage 30a.

Moreover, although the metal plates 22 onto which the thermal conductive sheets 23 are adhered are provided individually on both the side faces of the cabinets 21c in the first embodiment, the present invention is not limited to this, and the metal plates 22 may be provided only on one side faces of the cabinets 21c.

In the second embodiment, the areas of the portions protruding to the draft passage 30a, of the heat sinks 601 are changed, and thus a cooling effect in each of the disk boxes 10 is changed. However, such an effect change may be realized by changing the material of the heat sinks 601. For example, iron may be used as the material of the heat sinks 601 of the disk boxes 10 accommodated in the upper portion of the rack 50, and aluminum, higher in thermal conductivity than iron, may be used as the material of the heat sinks 601 of the disk boxes 10 accommodated in the lower portion of the rack 50. Thus, although the air flow in the draft passage 30a in the lower portion of the rack 50 is weaker as compared with that in the upper portion thereof, a cooling effect equivalent to that in the upper portion of the rack 50 can be obtained also in the lower portion of the rack 50.

Moreover, although the thermal conductive sheets 23 are adhered onto the protection fixings 21b included in the cabinets 21c in the second embodiment, the protection fixings 21b themselves, as the heat radiation members, may be brought into contact with the heat sinks 601.

Furthermore, although the copper sheets, of which the entire surfaces are coated with insulator, are used as the material of the thermal conductive sheets 23 in the second embodiment, silicon resin may be used as the material. The silicon resin has thermal conductivity and electric insulation properties, and can be brought into direct and intimate contact with an uneven portion due to pressurization. Thus, for example, disk modules 20 which are not covered with the protection fixings 21b are effectively cooled. Furthermore, the mutual electromagnetic interference among the electronic circuit sections in the disk modules 20 adjacent to one another can be effectively avoided.

Although the preferred embodiments of the present invention have been described in detail, it should be understood that various changes, substitutions and alterations can be made therein without departing from spirit and scope of the inventions as defined by the appended claims.

What is claimed is:

1. A disk array apparatus, comprising:
  a plurality of disk modules, in each of which a disk for recording information is accommodated in a cabinet having a plane;
  a plurality of disk boxes, each of which is configured by including an inlet ventilating surface and an exhaust ventilating surface arranged parallel to said inlet surface, and in each of which said plurality of disk modules are accommodated in line along a horizontal direction such that said planes are orthogonal to said inlet surfaces;
  a rack, in which a disk unit is formed by arranging two of said disk boxes along the horizontal direction such that exhaust surfaces of said disk boxes face each other in parallel, and in which a plurality of said disk units are accommodated in a stacking manner along a vertical direction, and of which surfaces facing said inlet surfaces of said disk boxes are capable of ventilation; and
  an exhaust fan which is arranged in said rack and allows air to pass through said inlet and said exhaust surfaces of said disk boxes and to flow through a draft passage formed parallel to said exhaust surfaces of said disk boxes in said rack to an outside of said rack,
  wherein a heat radiation member is provided on each of said planes of said disk modules;
  wherein said disk boxes include exhaust ports formed on said exhaust surfaces, and ends of said heat radiation members of said disk modules protrude from said exhaust ports to said draft passage.

2. A disk array apparatus according to claim 1, wherein said disk modules accommodated in a portion far from said exhaust fan include said heat radiation members having larger areas protruding from said exhaust ports to said draft passage as compared with protruding areas of said heat radiation members of said disk modules accommodated in a portion close to said exhaust fan.

3. A disk array apparatus according to claim 1, wherein said exhaust fan is arranged in an upper portion of said rack, and
  said disk modules accommodated in a lower portion of said rack include said heat radiation members having larger areas protruding from said exhaust ports to said draft passage as compared with protruding areas of said heat radiation members of said disk modules accommodated in the upper portion.

4. A disk array apparatus according to claim 1, wherein said disk modules accommodated in a portion far from said exhaust fan include said heat radiation members with higher thermal conductivity as compared with thermal conductivity of said heat radiation members of said disk modules accommodated in a portion close to said exhaust fan.

5. A disk array apparatus according to claim 1, wherein said exhaust fan is arranged in an upper portion of said rack, and
  said disk modules accommodated in a lower portion of said rack include said heat radiation members with higher thermal conductivity as compared with thermal conductivity of said heat radiation members of said disk modules accommodated in the upper portion.

6. A disk array apparatus according to claim 1, wherein said heat radiation members of said disk modules are thermal conductive sheets.

7. A disk array apparatus according to claim 6, wherein said thermal conductive sheets have electric insulation properties.

8. A disk array apparatus according to claim 6, wherein the material of said thermal conductive sheets is any of copper and silicon resin.

9. A disk array apparatus, comprising:
  a plurality of disk modules, in each of which a disk for recording information is accommodated in a cabinet having a plane;
  a plurality of disk boxes, each of which is configured by including an inlet ventilating surface and an exhaust ventilating surface arranged parallel to said inlet surface, and in each of which said plurality of disk modules are accommodated in line along a horizontal direction such that said planes are orthogonal to said inlet surfaces;
  a rack, in which a disk unit is formed by arranging two of said disk boxes along the horizontal direction such that exhaust surfaces of said disk boxes face each other in parallel, and in which a plurality of said disk units are accommodated in a stacking manner along a vertical direction, and of which surfaces facing said inlet surfaces of said disk boxes are capable of ventilation; and
  an exhaust fan which is arranged in said rack and allows air to pass through said inlet and said exhaust surfaces of said disk boxes and to flow through a draft passage formed parallel to said exhaust surfaces of said disk boxes in said rack to an outside of said rack,
  wherein a heat radiation member is provided on each of said planes of said disk modules;
  wherein said disk boxes include exhaust ports formed on said exhaust surfaces; and heat radiation plates protruding from said exhaust ports to said draft passage, and wherein said heat radiation plates and said heat radiation members of said disk modules are brought into contact with each other.

10. A disk array apparatus according to claim 9, wherein said disk boxes accommodated in a portion far from said exhaust fan include said heat radiation plates having larger areas protruding from said exhaust ports to said draft passage as compared with protruding areas of heat radiation plates of said disk boxes accommodated in a portion close to said exhaust fan.

11. A disk array apparatus according to claim 9, wherein said exhaust fan is arranged in an upper portion of said rack, and
said disk boxes accommodated in a lower portion of said rack include said heat radiation plates having larger areas protruding from said exhaust ports to said draft passage as compared with protruding areas of said heat radiation plates of said disk boxes accommodated in the upper portion.

12. A disk array apparatus according to clam 9, wherein said disk boxes accommodated in a portion far from said exhaust fan include said heat radiation plates with higher thermal conductivity as compared with thermal conductivity of said heat radiation plates of said disk boxes accommodated in a portion close to said exhaust fan.

13. A disk array apparatus according to claim 9, wherein said exhaust fan is arranged in an upper portion of said rack, and
said disk boxes accommodated in a lower portion of said rack include said heat radiation plates with higher thermal conductivity as compared with thermal conductivity of said heat radiation plates of said disk boxes accommodated in the upper portion.

14. A disk array apparatus according to claim 9, wherein said exhaust fan is arranged in an upper portion of said rack, and
material of said heat radiation plates included in said disk boxes accommodated in the upper portion is iron, and material of said heat radiation plates included in said disk boxes accommodated in a lower portion of said rack is aluminum.

15. A disk array apparatus, comprising:
a plurality of disk modules, in each of which a disk for recording information is accommodated in a cabinet having a plane;
a plurality of disk boxes, each of which is configured by including an inlet ventilating surface and an exhaust ventilating surface arranged parallel to said inlet surface, and in each of which said plurality of disk modules are accommodated in line along a horizontal direction such that said planes are orthogonal to said inlet surfaces;
a rack, in which a disk unit is formed by arranging two of said disk boxes along the horizontal direction such that exhaust surfaces of said disk boxes face each other in parallel, and in which a plurality of said disk units are accommodated in a stacking manner along a vertical direction, and of which surfaces facing said inlet surfaces of said disk boxes are capable of ventilation; and
an exhaust fan which is arranged in said rack and allows air to pass through said inlet and said exhaust surfaces of said disk boxes and to flow through a draft passage formed parallel to said exhaust surfaces of said disk boxes in said rack to an outside of said rack,
wherein a heat radiation member is provided on each of said planes of said disk modules, and
wherein said disk modules accommodated in a portion far from said exhaust fan include said heat radiation members with higher thermal conductivity as compared with thermal conductivity of said heat radiation members of said disk modules accommodated in a portion close to said exhaust fan.

16. A disk array apparatus, comprising:
a plurality of disk modules, in each of which a disk for recording information is accommodated in a cabinet having a plane;
a plurality of disk boxes, each of which is configured by including an inlet ventilating surface and an exhaust ventilating surface arranged parallel to said inlet surface, and in each of which said plurality of disk modules are accommodated in line along a horizontal direction such that said planes are orthogonal to said inlet surfaces;
a rack, in which a disk unit is formed by arranging two of said disk boxes along the horizontal direction such that exhaust surfaces of said disk boxes face each other in parallel, and in which a plurality of said disk units are accommodated in a stacking maimer along a vertical direction, and of which surfaces facing said inlet surfaces of said disk boxes are capable of ventilation; and
an exhaust fan which is arranged in said rack and allows air to pass through said inlet and said exhaust surfaces of said disk boxes and to flow through a draft passage formed parallel to said exhaust surfaces of said disk boxes in said rack to an outside of said rack,
wherein a heat radiation member is provided on each of said planes of said disk modules,
wherein said exhaust fan is arranged in an upper portion of said rack, and
wherein said disk modules accommodated in a lower portion of said rack include said heat radiation members with higher thermal conductivity as compared with thermal conductivity of said heat radiation members of said disk modules accommodated in the upper portion.

* * * * *